United States Patent
Chino

(10) Patent No.: US 8,344,492 B2
(45) Date of Patent: Jan. 1, 2013

(54) SEMICONDUCTOR DEVICE AND METHOD OF MANUFACTURING THE SAME, AND ELECTRONIC APPARATUS

(75) Inventor: Teruaki Chino, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 101 days.

(21) Appl. No.: 12/702,705

(22) Filed: Feb. 9, 2010

(65) Prior Publication Data
US 2010/0200975 A1    Aug. 12, 2010

(30) Foreign Application Priority Data

Feb. 12, 2009 (JP) .................................. 2009-029452

(51) Int. Cl.
*H01L 23/02* (2006.01)

(52) U.S. Cl. ........ 257/686; 257/678; 257/680; 257/691; 257/700; 257/723; 438/108; 438/109; 438/612; 438/613

(58) Field of Classification Search .................. 438/108, 438/612, 613; 257/686, 747, 775, 777, 778
See application file for complete search history.

(56) References Cited

U.S. PATENT DOCUMENTS

| | | | | |
|---|---|---|---|---|
| 5,222,014 A | * | 6/1993 | Lin | 361/792 |
| 7,091,619 B2 | * | 8/2006 | Aoyagi | 257/777 |
| 7,138,064 B2 | * | 11/2006 | Honda | 216/13 |
| 7,180,165 B2 | * | 2/2007 | Ellsberry et al. | 257/686 |
| RE42,363 E | * | 5/2011 | Ellsberry et al. | 257/686 |
| 7,935,572 B2 | * | 5/2011 | Karnezos | 438/108 |
| 8,044,494 B2 | * | 10/2011 | Mistry et al. | 257/659 |
| 2007/0290319 A1 | * | 12/2007 | Kim | 257/686 |
| 2009/0166834 A1 | * | 7/2009 | Yoon et al. | 257/686 |
| 2009/0188703 A1 | * | 7/2009 | Ito et al. | 174/255 |

FOREIGN PATENT DOCUMENTS

| | | |
|---|---|---|
| JP | 6-13541 | 1/1994 |
| JP | 07-007134 | 1/1995 |
| JP | 2001-144218 | 5/2001 |
| JP | 2003-298005 | 10/2003 |
| JP | 2003-309213 | 10/2003 |
| JP | 2005-353837 | 12/2005 |
| JP | 2007-123524 | 5/2007 |
| WO | 02/15266 | 2/2002 |
| WO | 02/33751 | 4/2002 |

* cited by examiner

*Primary Examiner* — Kyoung Lee
(74) *Attorney, Agent, or Firm* — Drinker Biddle & Reath LLP

(57) ABSTRACT

A first multilayer wiring structure has a first surface and a second surface positioned on an opposite side to the first surface, a first wiring pattern formed on the second surface side and a housing portion penetrating through the first multilayer wiring structure from the first surface to the second surface. An electronic component has an electrode pad. The electronic component is accommodated in the housing portion in a state that an electrode pad formation surface at the side where the electrode pad is formed is positioned on the second surface side of the first multilayer wiring structure. A second multilayer wiring structure has an insulating layer and a second wiring pattern which are stacked on the second surface of the first multilayer wiring structure and the electrode pad formation surface of the electronic component. The second wiring pattern is electrically connected to the first wiring pattern and the electrode pad.

11 Claims, 16 Drawing Sheets

SEMICONDUCTOR DEVICE AND METHOD OF MANUFACTURING THE SAME, AND ELECTRONIC APPARATUS

This application claims priority to Japanese Patent Application No. 2009-029452, filed Feb. 12, 2009, in the Japanese Patent Office. The Japanese Patent Application No. 2009-029452 is incorporated by reference in its entirety.

TECHNICAL FIELD

The present disclosure relates to a semiconductor device and a method of manufacturing the semiconductor device, and an electronic apparatus. More particularly, the present disclosure relates to a semiconductor device including an electronic component and a wiring board which has a pad connected electrically to another wiring board and is electrically connected to the electronic component, and a method of manufacturing the semiconductor device and an electronic apparatus.

RELATED ART

FIG. 1 is a sectional view showing a related-art electronic apparatus.

With reference to FIG. 1, a related-art electronic apparatus 200 includes semiconductor devices 201 and 202, and an internal connecting terminal 203. The semiconductor device 201 has a wiring board 211, an electronic component 212, an underfill resin 213 and an external connecting terminal 214.

The wiring board 211 is plate-shaped and has insulating layers 216 and 217 which are stacked, wiring patterns 219, 228 and 229, a pad 221, solder resist layers 222 and 226, and external connecting pads 223 and 224. The insulating layer 216 is provided on an upper surface 217A of the insulating layer 217.

The wiring pattern 219 and the pad 221 are provided on an upper surface 216A of the insulating layer 216. The wiring pattern 219 has pad portions 232 and 233 exposed from the solder resist layer 222. The pad 221 is exposed from the solder resist layer 222.

The solder resist layer 222 is provided on the upper surface 216A of the insulating layer 216. The external connecting pads 223 and 224 are provided on a lower surface 217B of the insulating layer 217. Lower surfaces of the external connecting pads 223 and 224 are exposed from the solder resist layer 226.

The solder resist layer 226 is provided on the lower surface 217B of the insulating layer 217. The wiring patterns 228 and 229 are provided in the insulating layers 216 and 217 which are stacked. The wiring pattern 228 is connected to the pad portion 233 and the external connecting pad 223. The wiring pattern 229 is connected to the pad 221 and the external connecting pad 224.

The electronic component 212 is disposed between the semiconductor device 201 and the semiconductor device 202. The electronic component 212 has an electrode pad 236. The electrode pad 236 is electrically connected to the pad portion 232 through a bump 237 (for example, a solder bump). As the electronic component 212 having the structure, it is possible to use a semiconductor chip, for example.

The underfill resin 213 is provided to fill a clearance between the electronic component 212 and the wiring board 211. The external connecting terminal 214 is provided on the lower surfaces of the external connecting pads 223 and 224.

The semiconductor device 202 is disposed above the semiconductor device 201 and has a wiring board 241, an electronic component 243 and a mold resin 246. The wiring board 241 is plate-shaped and has pads 251, 252 and 254. The pad 251 is opposed to the pad portion 233 and is electrically connected to the pad portion 233 through the internal connecting terminal 203. The pad 252 is opposed to the pad 221 and is electrically connected to the pad 221 through the internal connecting terminal 203. The pad 254 is electrically connected to the pad 251 or the pad 252.

The electronic component 243 is bonded onto the wiring board 241, and furthermore, is electrically connected to the pad 254 through a metal wire 244. As the electronic component 243, it is possible to use a semiconductor chip, for example.

The mold resin 246 is provided on the wiring board 241. The mold resin 246 seals the metal wire 244 and the electronic component 243.

The internal connecting terminal 203 has such a size that the electronic component 212 and the semiconductor device 202 do not come in contact with each other. A height of the internal connecting terminal 203 can be set to be 200 μm, for example (see Patent Document 1, for instance).

[Patent Document 1] JP-A-6-13541 Publication

In the related-art semiconductor device 201, however, the bump 237 is used to mount, on the wiring board 211, the electronic component 212 disposed on a side of an upper surface of the plate-shaped wiring board 211 (a surface of the wiring board 211 which is opposed to the plate-shaped wiring board 241). For this reason, there is a problem in that a size in a height direction of the semiconductor device 201 is increased.

In the related-art electronic apparatus 200, moreover, the height of the internal connecting terminal 203 for electrically connecting the semiconductor device 201 to the semiconductor device 202 is to be greater than a value obtained by adding a height of the electronic component 212 and that of the bump 237. For this reason, there is a problem in that a size in a thickness direction of the electronic apparatus 200 is increased.

SUMMARY

Exemplary embodiments of the present invention provide a semiconductor device which can reduce a size in a thickness direction and a method of manufacturing the semiconductor device, and an electronic apparatus.

A semiconductor device according to an exemplary embodiment of the invention comprises:

a first multilayer wiring structure having a first surface and a second surface which is positioned on an opposite side to the first surface, the first multilayer wiring structure having a first wiring pattern formed on the second surface side and a housing portion penetrating through the first multilayer wiring structure from the first surface to the second surface;

an electronic component having an electrode pad, the electronic component being accommodated in the housing portion in a state that an electrode pad formation surface at the side where the electrode pad is formed is positioned on the second surface side of the first multilayer wiring structure; and a second multilayer wiring structure having an insulating layer and a second wiring pattern which are stacked on the second surface of the first multilayer wiring structure and the electrode pad formation surface of the electronic component, wherein the second wiring pattern is electrically connected to the first wiring pattern and the electrode pad.

The second wiring pattern may have vias penetrating through the insulating layer, and the vias may be directly connected to the first wiring pattern and the electrode pad.

According to the exemplary embodiment of the invention, the electronic component is accommodated in the housing portion in a state that the electrode pad formation surface is positioned on the second surface side of the first multilayer wiring structure, and furthermore, the vias of the second wiring pattern is directly connected to the first wiring pattern and the electrode pad. Consequently, it is possible to lessen an amount of protrusion of the electronic component from the upper surface of the wiring board, and furthermore, it is not necessary to use a bump which has been required in the related art when electrically connecting the electrode pad to the wiring pattern. Therefore, it is possible to reduce a size in a thickness direction of the semiconductor device.

A method of manufacturing a semiconductor device according to an exemplary embodiment of the invention comprises:

a first step of forming a first multilayer wiring structure having a first surface and a second surface positioned on an opposite side to the first surface, a first wiring pattern formed on the second surface side, and a housing portion penetrating through the first multilayer wiring structure from the first surface to the second surface;

a second step of bonding the first multilayer wiring structure to a support in a state that the second surface of the first multilayer wiring structure is in contact with the support;

a third step of bonding an electronic component on the support in a state that an electrode pad formation surface at the side where an electrode pad is formed of the electronic component is bonded to a portion exposed from the housing portion of the support;

a fourth step of filing a clearance between a side surface of the housing portion and a side surface of the electronic component with a sealing resin;

a fifth step of removing the support; and a sixth step of forming a second multilayer wiring structure by stacking an insulating layer and a second wiring pattern on the second surface of the first multilayer wiring structure and the electrode pad formation surface of the electronic component and the sealing resin which are exposed by removing the support in the fifth step.

The second wiring pattern may have vias penetrating through the insulating layer, and the vias may be directly connected to the first wiring pattern and the electrode pad at the sixth step.

The fourth step may include forming the sealing resin by filling the clearance between the side surface of the housing portion and the side surface of the electronic component and also covering a surface of the electronic component which is positioned on an opposite side to the electrode pad formation surface and the first surface of the first multilayer wiring structure, and then reducing a thickness of the electronic component by polishing the sealing resin and the electronic component in a part positioned on an opposite side to the electrode pad formation surface.

According to the exemplary embodiment of the invention, the first multilayer wiring structure having the housing portion is bonded to the support, the electronic component having the greater thickness than the thickness of the first multilayer wiring structure is subsequently bonded to the support in the portion exposed to the housing portion, the sealing resin for covering the first surface of the first multilayer wiring structure and the electronic component is then formed, and the sealing resin and the electronic component are thereafter polished to reduce the thickness of the electronic component (to change the electronic component into a thin plate), and furthermore, the surface of the electronic component subjected to the polishing is made on almost the level with the upper surface of the sealing resin. Consequently, the electronic component changed into the thin plate is prevented from being protruded from the upper surface of the wiring board. Thus, it is possible to reduce the size in the thickness direction of the semiconductor device.

After the removal of the support, moreover, the second multilayer wiring structure including the second wiring pattern to be directly connected to the electrode pad is formed on the second surface of the first multilayer wiring structure, the surface of the electronic component at the side where the electrode pad is formed and the lower surface of the sealing resin in the portion formed in the housing portion. Consequently, it is possible to electrically connect the electrode pad to the second wiring pattern without using a bump (for example, a solder bump or an Au bump). Thus, it is possible to further reduce the size in the thickness direction of the semiconductor device.

Other features and advantages may be apparent from the following detailed description, the accompanying drawings and the claims.

DETAILED DESCRIPTION

Exemplary embodiments according to the invention will be described below with reference to the drawings.
(First Embodiment)
FIG. 2 is a sectional view showing an electronic apparatus according to a first embodiment of the invention.

Figure 2:
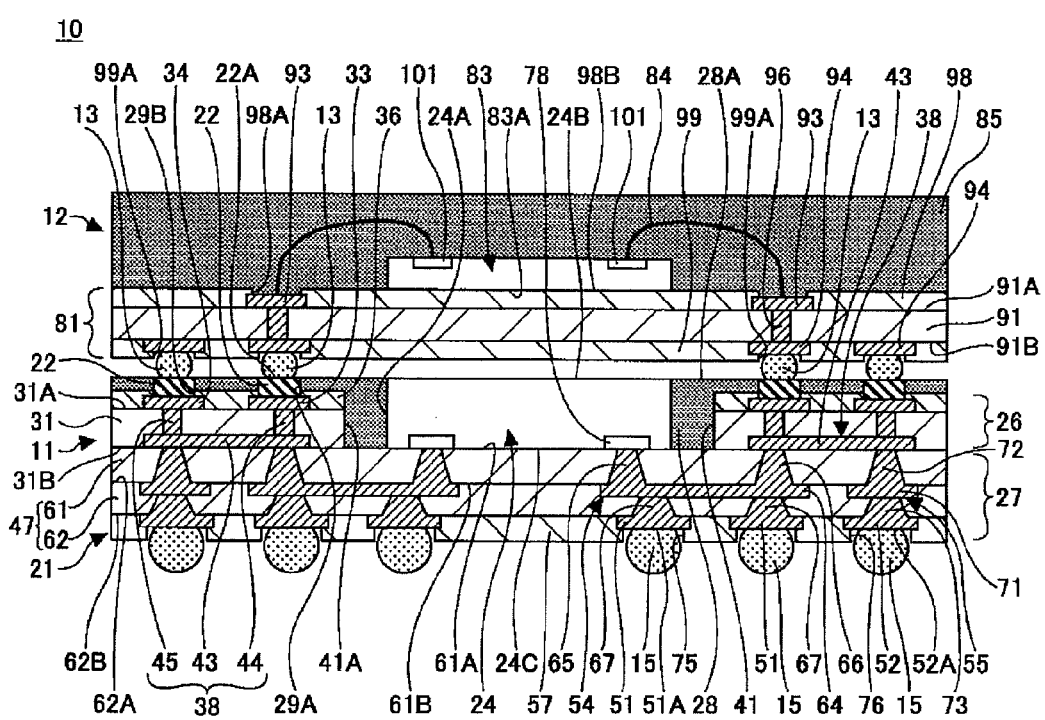
FIG. 2 is a sectional view showing an electronic apparatus according to a first embodiment of the invention.

With reference to FIG. 2, an electronic apparatus 10 according to the first embodiment has a semiconductor device 11, a semiconductor device 12 to be another semiconductor device, an internal connecting terminal 13 and an external connecting terminal 15.

The semiconductor device 11 has a wiring board 21, a conductive member 22 and an electronic component 24. The wiring board 21 has a first multilayer wiring structure 26, a second multilayer wiring structure 27, a sealing resin 28 and opening portions 29A and 29B.

The first multilayer wiring structure 26 is disposed on the second multilayer wiring structure 27 to be opposed to a side surface 24A of the electronic component 24. The first multilayer wiring structure 26 is caused to take such a shape as to surround the side surface 24A of the electronic component 24 (more specifically, a shape of a frame seen on a plane). The first multilayer wiring structure 26 has a first substrate body 31, pads 33 and 34 to be a plurality of pads, a solder resist layer 36, and a first wiring pattern 38.

Figure 3:
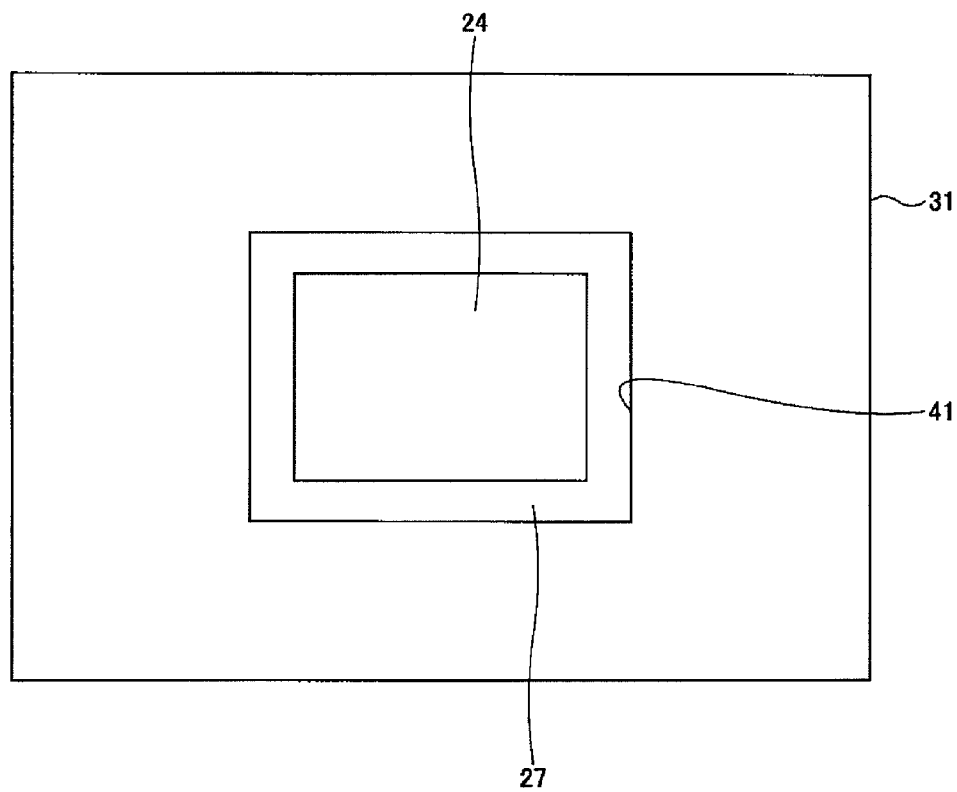
FIG. 3 is a typical plan view for explaining a shape of a first substrate body.

FIG. 3 is a typical plan view for explaining a shape of the first substrate body.

With reference to FIGS. 2 and 3, the first substrate body 31 is set to take a shape of a frame seen on a plane. A housing portion 41 penetrating through the first substrate body 31 is formed in a central part of the first substrate body 31.

As the first substrate body 31, for example, it is possible to use an insulating layer. As the insulating layer, moreover, it is possible to use an insulating resin layer (such as a resin layer constituted by an epoxy resin), for example. Although FIG. 2 shows, as an example, the case in which only a single insulating layer is used as the first substrate body 31, it is also possible to constitute the first substrate body 31 by stacking a plurality of insulating layers.

With reference to FIG. 2, a plurality of pads 33 and 34 is provided on an upper surface 31A of the first substrate body 31. The pad 34 is disposed on the upper surface 31A of the first substrate body 31 in a portion positioned on an outside of a region in which the pad 33 is formed. As a material of the pads 33 and 34, for example, it is possible to use Cu. The solder resist layer 36 is provided to cover the upper surface 31A of the first substrate body 31.

The first wiring pattern 38 has a wiring 43 and vias 44 and 45. The wiring 43 is provided in the first substrate body 31. A lower surface of the wiring 43 is disposed on almost the level with a lower surface 31B of the first substrate body 31. The wiring 43 is connected to a second wiring pattern 54 (one of components in the second multilayer wiring structure 27) connected to one of electrode pads 78 provided in the electronic component 24 which will be described below. The wiring 43 is electrically connected to the pad 33 through the via 44 and is electrically connected to the pad 34 through the via 45.

Thus, there is provided the first wiring pattern 38 which is connected to the second wiring pattern 54 connected to one of the electrode pads 78 and to which the pads (the pads 33 and 34) are connected. Consequently, it is possible to electrically connect one of the electrode pads 78 to the pads (the pads 33 and 34) without increasing a size in a planar direction of the wiring board 21.

As the first multilayer wiring structure 26 thus constituted above, for example, it is possible to use various substrates such as a buildup substrate and a glass epoxy substrate.

The second multilayer wiring structure 27 is disposed under the first multilayer wiring structure 26, and furthermore, is constituted integrally with the first multilayer wiring structure 26. The second multilayer wiring structure 27 is plate-shaped and functions as a member for closing a lower end of the housing portion 41. The second multilayer wiring structure 27 has a second substrate body 47, external connecting pads 51 and 52, second wiring patterns 54 and 55, and a solder resist layer 57.

The second substrate body 47 has such a structure that insulating layers 61 and 62 to be insulating layers are stacked. The insulating layer 61 is provided on an upper surface 62A of the insulating layer 62. An upper surface 61A of the insulating layer 61 is provided in contact with the lower surface 31B of the first substrate body 31, and furthermore, is fixed to the first substrate body 31. The upper surface 61A of the insulating layer 61 in a portion exposed from the housing portion 41 serves as a bottom face of the housing portion 41.

The insulating layer 62 is provided on a lower surface 61B of the insulating layer 61. As the insulating layers 61 and 62, for example, it is possible to use an insulating resin layer (such as a resin layer constituted by an epoxy resin).

The external connecting pads 51 and 52 are provided on a lower surface 62B of the insulating layer 62. The external connecting pad 51 is connected to the second wiring pattern 54. The external connecting pad 51 is electrically connected to the electrode pad 78 of the electronic component 24 and the first wiring pattern 38 through the second wiring pattern 54.

The external connecting pad 52 is connected to the second wiring pattern 55. The external connecting pad 52 is electrically connected to the first wiring pattern 38 through the second wiring pattern 55. As a material of the external connecting pads 51 and 52, for example, it is possible to use Cu.

The second wiring pattern 54 is provided in the second substrate body 47. The second wiring pattern 54 has a wiring 64 and vias 65 to 67. The wiring 64 is provided on the lower surface 61B of the insulating layer 61. The wiring 64 is covered with the insulating layer 62.

The via 65 is provided to penetrate through the insulating layer 61 in an opposed part to the electrode pad 78 provided in the electronic component 24. An upper end of the via 65 is directly connected to the electrode pad 78 and a lower end of the via 65 is connected to the wiring 64. Consequently, the via 65 electrically connects the electronic component 24 to the wiring 64.

The via 66 is provided to penetrate through the insulating layer 61 in a part disposed between the wiring 43 and the wiring 64. An upper end of the via 66 is connected to the wiring 43 and a lower end of the via 66 is connected to the wiring 64. Consequently, the via 66 electrically connects the wiring 43 to the wiring 64.

The via 67 is provided to penetrate through the insulating layer 62 in a part positioned between the wiring 64 and the external connecting pad 51. An upper end of the via 67 is connected to the wiring 64 and a lower end of the via 67 is connected to the external connecting pad 51. Consequently, the via 67 electrically connects the wiring 64 to the external connecting pad 51.

Figure 1:
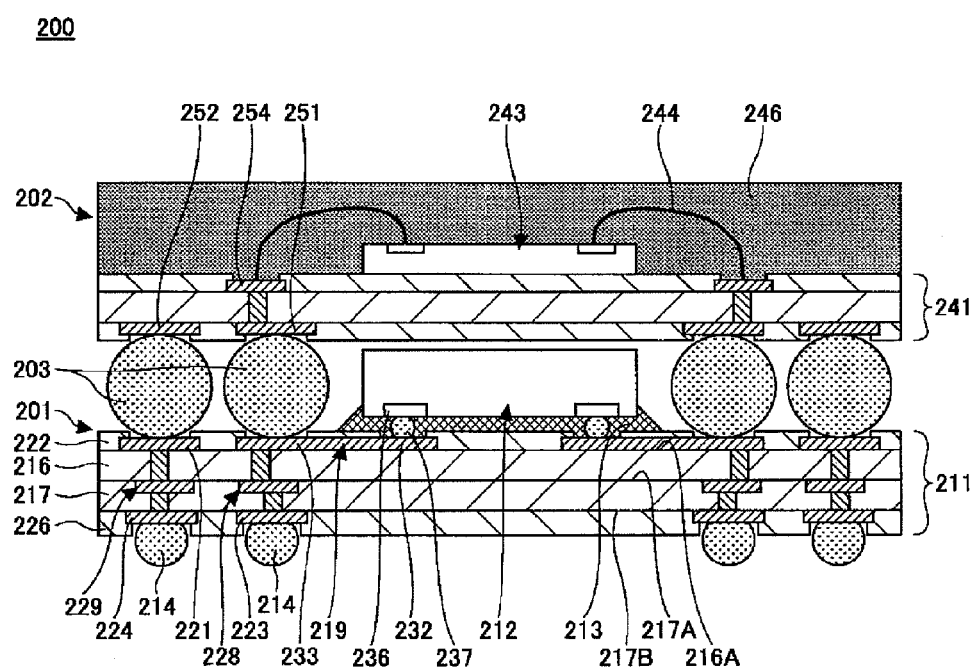
FIG. 1 is a sectional view showing a related-art electronic apparatus.

Thus, the second wiring pattern 54 constituting the wiring board 21 is provided in the second substrate body 47 to directly connect the upper end of the via 65 which is one of the components of the second wiring pattern 54 to the electrode pad 78. Consequently, there is not required the bump 237 (see FIG. 1) which has been required for electrically connecting the electrode pad 236 to the wiring pattern 219 in the related art. Therefore, it is possible to reduce a size in a thickness direction of the semiconductor device 10.

As a material of the second wiring pattern 54 having the structure, for example, it is possible to use Cu.

The second wiring pattern 55 is provided in the second substrate body 47. The second wiring pattern 55 has a wiring 71 and vias 72 and 73. The wiring 71 is provided on the lower surface 61B of the insulating layer 61. The wiring 71 is covered with the insulating layer 62.

The via 72 is provided to penetrate through the insulating layer 61 in a part disposed between the wiring 43 and the wiring 71. An upper end of the via 72 is connected to the wiring 43 and a lower end of the via 72 is connected to the wiring 71. Consequently, the via 72 electrically connects the wiring 43 to the wiring 71.

The via 73 is provided to penetrate through the insulating layer 62 in a part positioned between the wiring 71 and the external connecting pad 52. An upper end of the via 73 is connected to the wiring 71 and a lower end of the via 73 is connected to the external connecting pad 52. Consequently, the via 73 electrically connects the wiring 71 to the external connecting pad 52.

As a material of the second wiring pattern 55 having the structure, for example, it is possible to use Cu.

The solder resist layer 57 is provided on the lower surface 62B of the insulating layer 62. The solder resist layer 57 has an opening portion 75 for exposing a lower surface 51A of the external connecting pad 51 and an opening portion 76 for exposing a lower surface 52A of the external connecting pad 52.

A thickness of the second multilayer wiring structure 27 having the structure is set to be smaller than a thickness of the electronic component 24 (for example, 250 μm) and a total value (for example, 250 μm) of a thickness of the first multilayer wiring structure 26 and that of the sealing resin 28 in a part provided on the first multilayer wiring structure 26. In the case in which the thickness of the electronic component 24 is 250 μm, the thickness of the second multilayer wiring structure 27 can be set to be 80 to 100 μm, for example.

In other words, the second multilayer wiring structure 27 is formed like a layer on a structure constituted by the first multilayer wiring structure 26, the electronic component 24 and the sealing resin 28 (a structure functioning as a core member).

The sealing resin 28 serves to seal the electronic component 24 and is provided in a clearance between a side surface 41A of the housing portion 41 and the side surface 24A of the electronic component 24 and on the solder resist layer 36. The sealing resin 28 fills the clearance between the side surface 41A of the housing portion 41 and the side surface 24A of the electronic component 24. An upper surface 28A of the sealing resin 28 is set to be a flat surface. The upper surface 28A of the sealing resin 28 is constituted to be on almost the level with a surface 24B of the electronic component 24 (a surface of the electronic component 24 positioned on an opposite side to a surface on which the electrode pad 78 is formed). As the sealing resin 28, for example, it is possible to use a mold resin. As a material of the mold resin, moreover, it is possible to use an epoxy resin, for example.

The opening portion 29A is formed to penetrate through the solder resist layer 36 and the sealing resin 28 in a part positioned on the pad 33. The opening portion 29B is formed to penetrate through the solder resist layer 36 and the sealing resin 28 in a part positioned on the pad 34. In the case in which diameters of the pads 33 and 34 are 30 μm, diameters of the opening portions 29A and 29B can be set to be 20 μm, for example. In this case, depths of the opening portions 29A and 29B can be set to be 50 μm, for example.

The conductive member 22 is provided in the opening portion 29A and the opening portion 29B. The conductive member 22 fills the opening portion 29A and the opening portion 29B. An upper surface 22A of the conductive member 22 is set to be a flat surface. The upper surface 22A of the conductive member 22 is constituted to be on almost the level with the upper surface 28A of the sealing resin 28 and the surface 24B of the electronic component 24. In other words, an upper surface of the semiconductor device 11 (an opposed surface to the second semiconductor device 12) is set to be a flat surface.

By setting the upper surface of the semiconductor device 11 which is opposed to the semiconductor device 12 to be the flat surface, thus, it is possible to reduce a size in a height direction of the internal connecting terminal 13 which is disposed between the semiconductor device 11 and the semiconductor device 12 and electrically connects the semiconductor device 11 to the semiconductor device 12. Therefore, it is possible to reduce the size in the thickness direction of the electronic apparatus 10.

The conductive member 22 is electrically connected to the pad 33 or the pad 34. The conductive member 22 is connected to the internal connecting terminal 13. The conductive member 22 is electrically connected to the semiconductor device 12 through the internal connecting terminal 13. As a material of the conductive member 22, for example, it is possible to use an Au plated film or a Cu/Ni/Au stacked film in which a Cu plated film, a nickel plated film and a gold plated film are sequentially stacked on the pads 33 and 34.

The electronic component 24 is a thinned plate and has the electrode pads 78. The electrode pads 78 are disposed on a surface 24C side of the electronic component 24 which is positioned on an opposite side to the surface 24B. The electronic component 24 is provided in the housing portion 41 in such a manner that the electrode pads 78 and the surface 24C are disposed in contact with the upper surface 61A of the insulating layer 61 in a corresponding part to the bottom face of the housing portion 41. The surface 24B of the electronic component 24 is exposed from an upper end of the housing portion 41. The clearance between the side surface 24A of the electronic component 24 and the side surface 41A of the housing portion 41 is sealed with the sealing resin 28. The surface 24B of the electronic component 24 is disposed on almost the level with the upper surface 28A of the sealing resin 28.

The electrode pad 78 is connected to the upper end of the via 65 (one of the components of the second wiring pattern 54). Consequently, the electrode pad 78 is electrically connected to the external connecting pad 51 and the first wiring pattern 38 connected to the pads 33 and 34 (the pads) through the second wiring pattern 54. As the electronic component 24, for example, it is possible to use a semiconductor chip for an MPU (Micro Processing Unit). A thickness of the electronic component 24 to be the thinned plate can be set to be 250 μm, for example.

According to the semiconductor device in accordance with the embodiment, there is provided the housing portion 41 penetrating through the first substrate body 31 in the part in which the electrode pads 33 and 34 are not formed, and the electronic component 24 is provided in the housing portion 41 in such a manner that the electrode pad 78 and the surface 24C of the electronic component 24 on the side where the electrode pad 78 is formed and the bottom face of the housing portion 41 (the upper surface 61A of the insulating layer 61 in the part which is exposed to the housing portion 41) are disposed in contact with each other. Consequently, the electronic component 24 is prevented from being protruded upward from an upper surface of the wiring board 21. Therefore, it is possible to reduce a size in a thickness direction of the semiconductor device 11.

Moreover, the upper end of the via 65 constituting the second wiring pattern 54 provided in the second substrate body 47 and the electrode pad 78 are directly connected to each other so that it is not necessary to provide the bump 237 (see FIG. 1) which has been required for electrically connecting the electronic component 212 to the wiring pattern 219 in the related art. Therefore, it is possible to further reduce the size in the thickness direction of the semiconductor device 11.

The semiconductor device 12 is disposed above the semiconductor device 11 and has a wiring board 81, an electronic component 83 and a mold resin 85. The wiring board 81 has a substrate body 91, a pad 93, a pad 94 to be a semiconductor device connecting pad, a wiring pattern 96 and solder resist layers 98 and 99. A substrate body 91 is plate-shaped. As the substrate body 91, for example, it is possible to use a stacked product in which a plurality of insulating resin layers is stacked.

The pad 93 is provided on an upper surface 91A of the substrate body 91. The pad 93 is connected to one of ends of a metal wire 84 (for example, an Au wire) and an upper end of the wiring pattern 96. The pad 93 is electrically connected to the electronic component 83 through the metal wire 84. As a material of the pad 93, for example, it is possible to use Cu.

The pad 94 is provided on a lower surface 91B of the substrate body 91. The pad 94 is connected to a lower end of the wiring pattern 96 and the internal connecting terminal 13. The pad 94 is electrically connected to the pad 93 through the wiring pattern 96, and furthermore, is electrically connected to the first semiconductor device 11 (more specifically, the wiring board 21 and the electronic component 24) through the internal connecting terminal 13. As a material of the pad 94, for example, it is possible to use Cu.

The wiring pattern 96 is provided in the substrate body 91 to penetrate through the substrate body 91. The wiring pattern 96 can be constituted by a plurality of wirings and vias (not shown), for example.

The solder resist layer 98 is provided on the upper surface 91A of the substrate body 91. The solder resist layer 98 has an opening portion 98A for exposing an upper surface of the pad 93.

The solder resist layer 99 is provided on the lower surface 91B of the substrate body 91. The solder resist layer 99 has an opening portion 99A for exposing a lower surface of the pad 94.

The electronic component 83 has a plurality of electrode pads 101. The electronic component 83 is bonded onto the solder resist layer 98 in such a manner that a surface 83A of the electronic component 83 on a side where the electrode pad 101 is not formed is provided in contact with an upper surface 98B of the solder resist layer 98. The electrode pad 101 is connected to the other end of the metal wire 84. Consequently, the electronic component 83 is electrically connected to the wiring board 81 through the metal wire 84. As the electronic component 83, for example, it is possible to use a semiconductor chip for a memory.

The mold resin 85 is provided on the upper surface of the pad 93 and the upper surface 98B of the solder resist 98 in order to cover the electronic component 83 and the metal wire 84. The mold resin 85 serves to seal the electronic component 83 and the metal wire 84. As a material of the mold resin 85, for example, it is possible to use an epoxy resin.

The internal connecting terminal 13 is disposed between the semiconductor device 11 and the semiconductor device 12, and furthermore, is connected to the conductive member 22 and the pad 94. Consequently, the internal connecting terminal 13 electrically connects the semiconductor device 11 to the semiconductor device 12. As described above, the upper surface of the semiconductor device 11 which is opposed to the semiconductor device 12 is set to be the flat surface. Therefore, it is possible to reduce a size in a height direction of the internal connecting terminal 13. The size in the height direction of the internal connecting terminal 13 can be set to be 80 μm, for example. As the internal connecting terminal 13, for example, it is possible to use a solder ball.

The external connecting terminal 15 is provided on the lower surfaces 51A and 52A of the external connecting pads 51 and 52. The external connecting terminal 15 serves to mount the electronic apparatus 10 on a mounting substrate such as a mother board (which is not shown). As the external connecting terminal 15, for example, it is possible to use a solder ball.

According to the electronic apparatus in accordance with the embodiment, there are provided the housing portion 41 penetrating through the first substrate body 31 in the part in which the pads 33 and 34 are not formed, the electronic component 24 disposed in the housing portion 41 in such a manner that the surface 24C of the electronic component 24 on the side where the electrode pad 78 is formed is placed in contact with the bottom face of the housing portion 41 (the upper surface 61A of the insulating layer 61 in the part exposed to the housing portion 41), and the second wiring pattern 54 which is provided in the second substrate body 47 and is directly connected to the electrode pad 78, and furthermore, the first semiconductor device 11 in which the upper surface opposed to the second semiconductor device 12 is set to be the flat surface is electrically connected to the second semiconductor device 12 disposed above the first semiconductor device 11 through the internal connecting terminal 13. Consequently, it is possible to reduce the size in the height direction of the internal connecting terminal 13. Therefore, it is possible to reduce the size in the thickness direction of the electronic apparatus 10.

Figure 4:
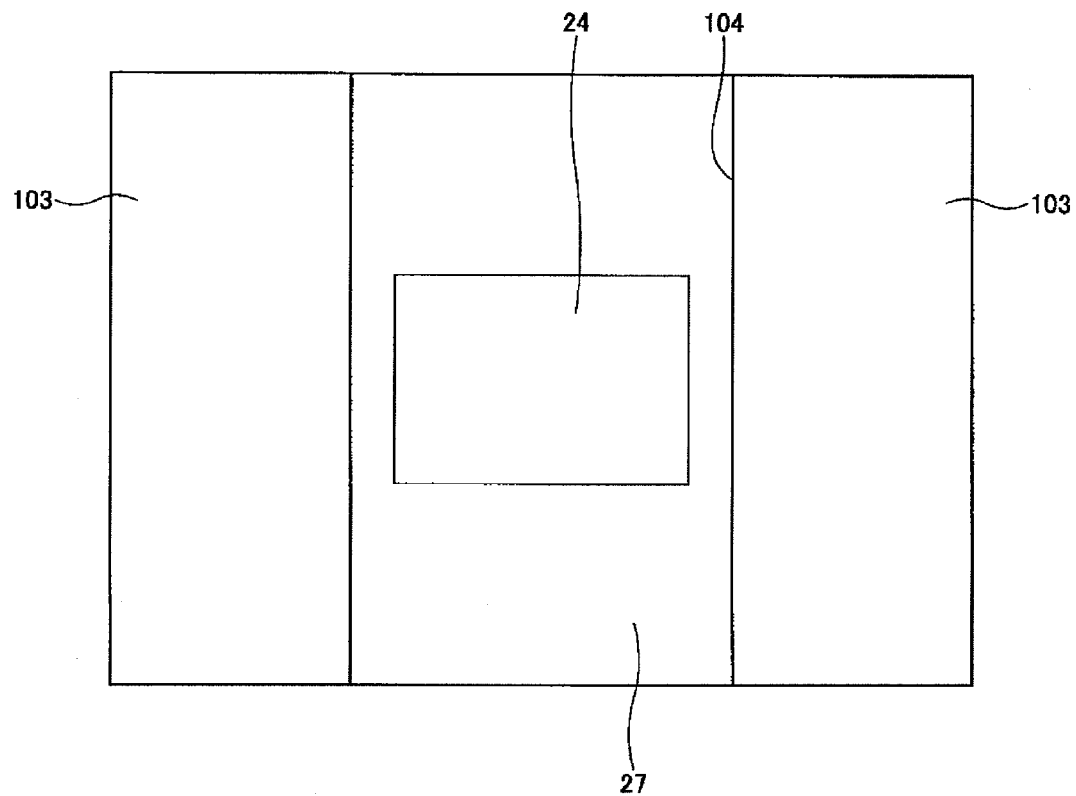
FIG. 4 is a view showing another example of a first multilayer wiring structure.

FIG. 4 is a view showing another example of the first multilayer wiring structure.

Although the description has been given by taking, as an example, the case in which the multilayer wiring structure taking the shape of the frame seen on a plane is used as the first multilayer wiring structure 26 in the embodiment, it is also possible to dispose two first multilayer wiring structures 103 taking a rectangular shape seen on a plane apart from each other and to use a concave portion formed between the two first multilayer wiring structures 103 as a housing portion 104 for accommodating the electronic component 24 as shown in FIG. 4, for example.

FIGS. 5 to 15 are views showing a process for manufacturing a semiconductor device according to the first embodiment of the invention. In FIGS. 5 to 15, the same components as those in the semiconductor device 11 according to the first embodiment have the same designations With reference to FIGS. 5 to 15, description will be given to a method of manufacturing the semiconductor device 11 according to the first embodiment. First of all, at a step shown in FIG. 5, a first multilayer wiring structure 26 having no housing portion 41 formed therein is provided by a well-known technique (for example, a buildup method) (a first multilayer wiring structure forming step).

As described above, the first multilayer wiring structure 26 has such a structure as to have a first substrate body 31, pads 33 and 34 to be a plurality of pads, a solder resist layer 36 and a first wiring pattern 38. A thickness of the first multilayer wiring structure 26 can be set to be 200 μm, for example. As the first multilayer wiring structure 26, for example, it is possible to use various substrates such as a buildup substrate and a glass epoxy substrate.

As the first substrate body 31, for example, it is possible to use an insulating layer. As the insulating layer, moreover, it is possible to use an insulating resin layer (such as a resin layer constituted by an epoxy resin), for example. The first wiring pattern 38 can be formed by a semiadditive method, for example. As a material of the first wiring pattern 38, for example, it is possible to use Cu.

Figure 5:
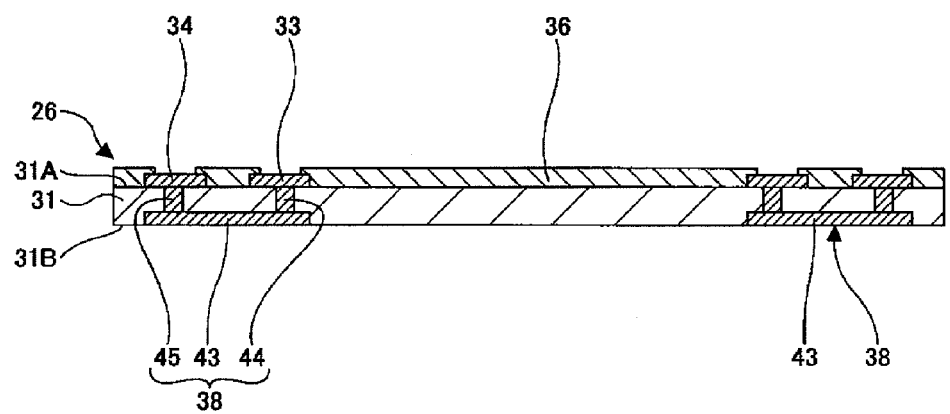
FIG. 5 is a view (No. 1) showing a step of manufacturing a semiconductor device according to the first embodiment of the invention.
Figure 6:
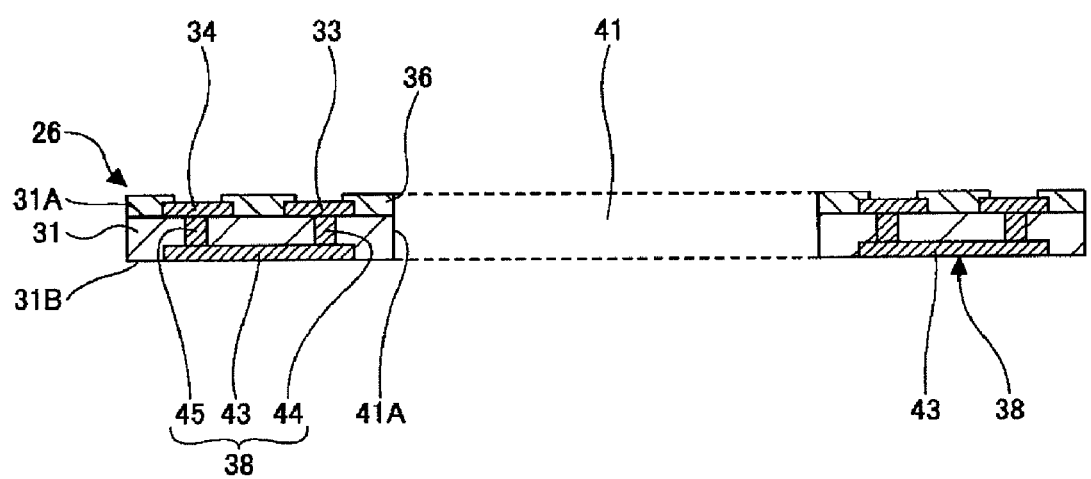
FIG. 6 is a view (No. 2) showing a step of manufacturing the semiconductor device according to the first embodiment of the invention.

At a step shown in FIG. 6, subsequently, there is formed the housing portion 41 penetrating through the first substrate body 31 and the solder resist layer 36 which are provided in the structure illustrated in FIG. 5 (a housing portion forming step). The housing portion 41 can be formed by a router, for example.

Figure 7:
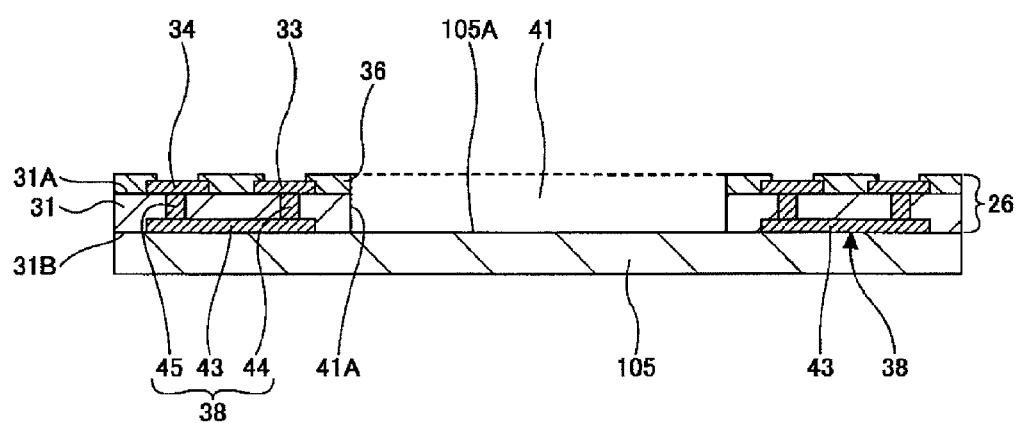
FIG. 7 is a view (No. 3) showing a step of manufacturing the semiconductor device according to the first embodiment of the invention.

At a step shown in FIG. 7, next, a support 105 is prepared and the first multilayer wiring structure 26 having the housing portion 41 formed therein is then bonded to an upper surface 105A of the support 105 in such a manner that the upper surface 105A of the support 105 is provided in contact with a lower surface 31B of the first substrate body 31 and a lower surface of a wiring 43 (the first wiring pattern 38 in a part exposed from the lower surface 31B of the first substrate body 31) (a first multilayer wiring structure bonding step).

As the support 105, for example, it is possible to use a glass plate, a silicon plate or a metal plate (for instance, a Cu plate). In the case in which the Cu plate is used as the support 105, a thickness of the support 105 can be set to be 200 μm, for example.

In order to bond the support 105 to the first multilayer wiring structure 26, it is possible to use an adhesive (for example, a resin having an adhesiveness), for instance. As a specific adhesive, for example, it is possible to use a die attach film.

Figure 8:
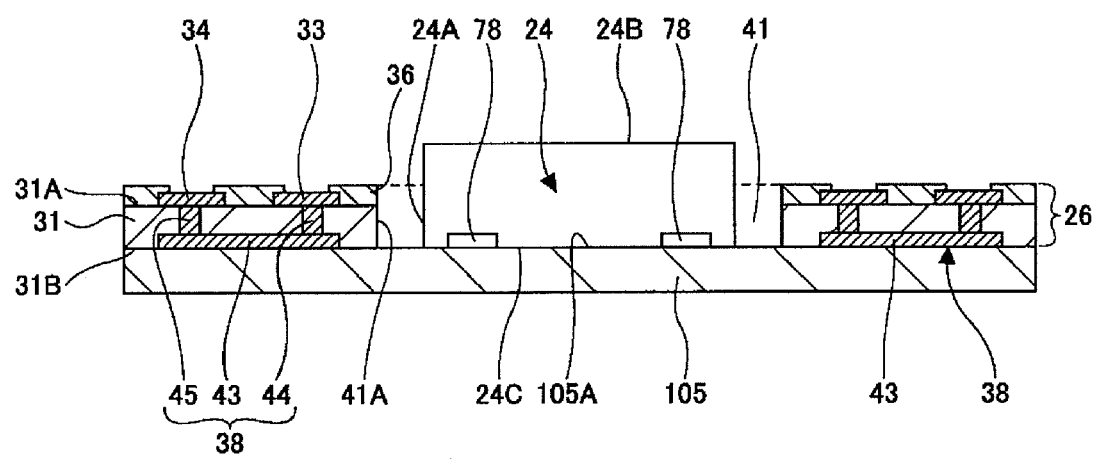
FIG. 8 is a view (No. 4) showing a step of manufacturing the semiconductor device according to the first embodiment of the invention.

At a step shown in FIG. 8, then, there is prepared an electronic component 24 which has a plurality of electrode pads 78 and is not changed into a thin plate. Thereafter, the electronic component 24 is bonded to the upper surface 105A of the support 105 in such a manner that a surface 24C of the electronic component 24 and the electrode pad 78 are provided in contact with the upper surface 105A of the support 105 in a part exposed from the housing portion 41 (an electronic component bonding step).

As the electronic component 24, for example, it is possible to use a semiconductor chip for an MPU (Micro Processing Unit). It is preferable that a thickness of the electronic component 24 which is not changed into the thin plate should be set to be greater than that of the first multilayer wiring structure 26. In the case in which the thickness of the first multilayer wiring structure 26 is 200 μm, the thickness of the electronic component 24 which is not changed into the thin plate can be set to be 750 μm, for example.

By bonding, to the upper surface 105A of the support 105, the electronic component 24 which is easily subjected to handling and is not changed into the thin plate, thus, it is possible to reliably bond the electronic component 24 in a desirable position of the support 105.

It is possible to use an adhesive (for example, a resin having an adhesiveness) in order to bond the support 105 to the electronic component 24, for instance. As a specific adhesiveness, for example, it is possible to use a die attach film.

Figure 9:
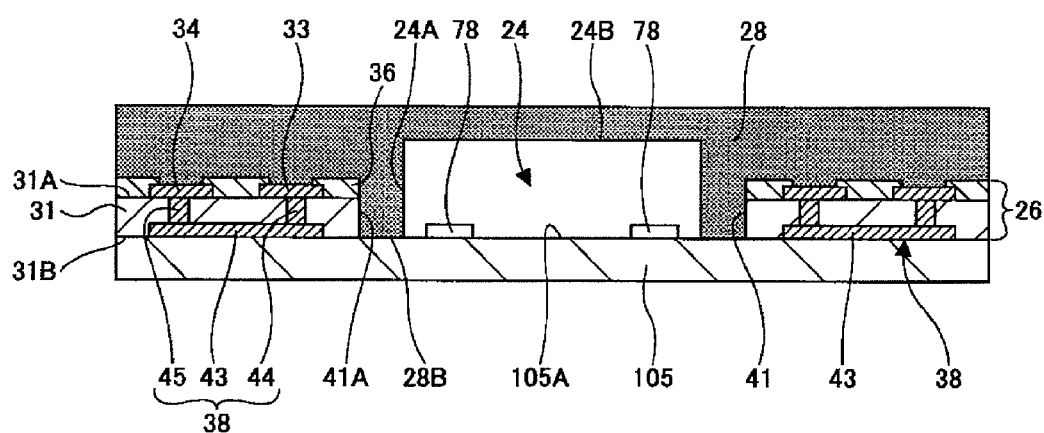
FIG. 9 is a view (No. 5) showing a step of manufacturing the semiconductor device according to the first embodiment of the invention.

At a step shown in FIG. 9, next, there is formed a sealing resin 28 for filling a clearance between a side surface 24A of the electronic component 24 and a side surface 41A of the housing portion 41 and covering a surface 24B of the electronic component 24 and an upper surface of the first multilayer wiring structure 26 (a sealing resin forming step).

The sealing resin 28 can be formed by a compression forming method or resin potting, for example. As the sealing resin 28, for example, it is possible to use a mold resin. As a material of the mold resin, for example, it is possible to use an epoxy resin.

Figure 10:
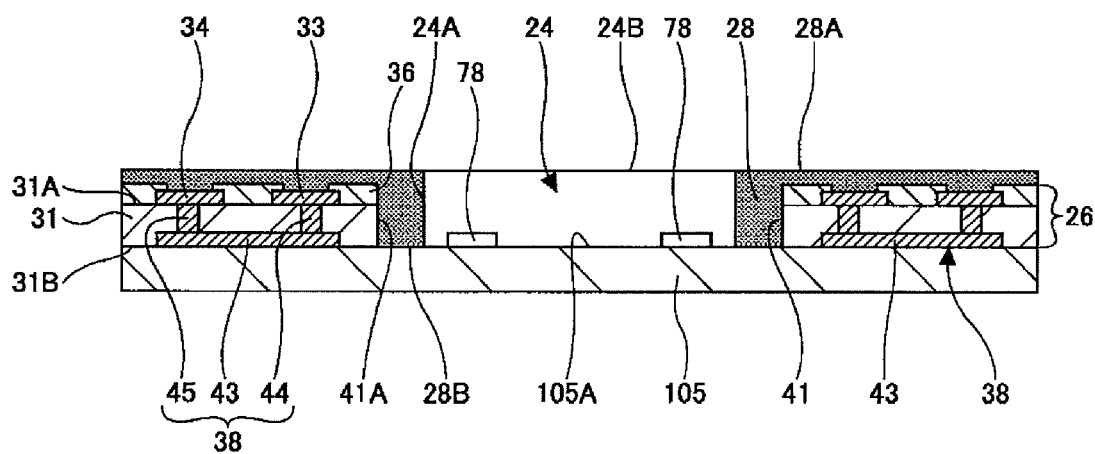
FIG. 10 is a view (No. 6) showing a step of manufacturing the semiconductor device according to the first embodiment of the invention.

At a step shown in FIG. 10, subsequently, the sealing resin 28 and the electronic component 24 in a part positioned on an opposite side to a side where the electrode pad 78 is formed are polished from an upper surface side of the structure illustrated in FIG. 9. Consequently, the thickness of the electronic component 24 is reduced (the electronic component 24 is changed into a thin plate), and furthermore, the surface 24B of the electronic component 24 is exposed from an upper surface of the sealing resin 28 (a polishing step).

Thus, the electronic component 24 having a greater thickness than a thickness of the first multilayer wiring structure 26 is bonded to the upper surface 105A of the support 105 in the part exposed to the housing portion 41, the sealing resin 28 covering the upper surface of the first multilayer wiring structure 26 and the electronic component 24 is then formed, and the sealing resin 28 and the electronic component 24 are thereafter polished. Consequently, the thickness of the electronic component 24 is reduced. Therefore, it is possible to reduce a size in a thickness direction of the first semiconductor device 11.

At the polishing step, moreover, it is preferable to carry out the polishing in such a manner that the surface 24B of the electronic component 24 is on almost the level with an upper surface 28A of the sealing resin 28.

By polishing the sealing resin 28 and the electronic component 24 to set the surface 24B of the electronic component 24 on almost the level with the upper surface 28A of the sealing resin 28, thus, it is possible to prevent the electronic component 24 from being protruded from the upper surface 28A of the sealing resin 28 which corresponds to the upper surface of a wiring board 21. Therefore, it is possible to reduce the size in the thickness direction of the first semiconductor device 11.

In the case in which the first multilayer wiring structure 26 has a thickness of 200 μm, the thickness of the electronic component 24 subjected to the polishing can be set to be 250 μm, for example.

Figure 11:
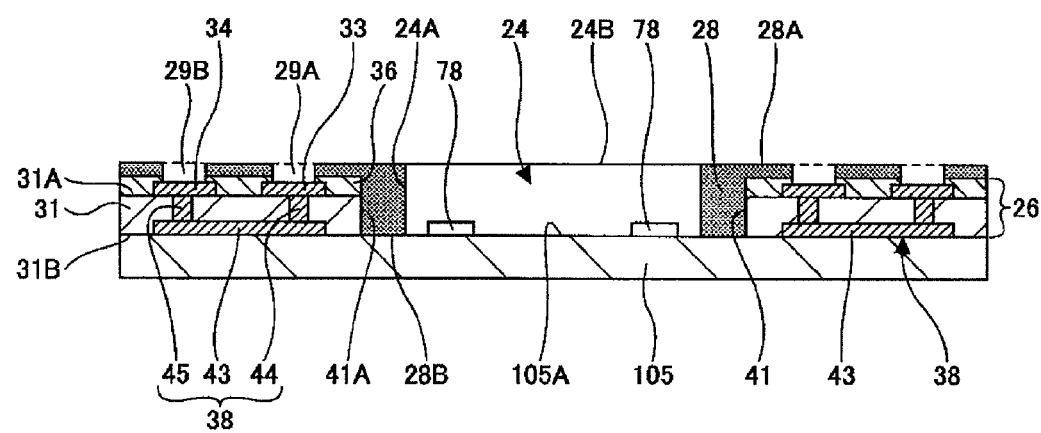
FIG. 11 is a view (No. 7) showing a step of manufacturing the semiconductor device according to the first embodiment of the invention.

At a step shown in FIG. 11, next, there are formed an opening portion 29A which penetrates through the sealing resin 28 in a part disposed on the pad 33 to expose the upper surface of the pad 33 and an opening portion 29B which penetrates through the sealing resin 28 in a part disposed on the pad 34 to expose the upper surface of the pad 34 (an opening portion forming step). The opening portions 29A and 29B can be formed by a laser processing method, for example.

At a step shown in FIG. 12, subsequently, there is formed a conductive member 22 for filling the opening portions 29A and 29B. The conductive member 22 can be formed by a plating method, for example. As the conductive member 22, for example, it is possible to use an Au plated film or a Cu/Ni/Au stacked film in which a Cu plated film, a nickel plated film and a gold plated film are sequentially stacked on the pads 33 and 34. In the case in which the pads 33 and 34 have a diameter of 30 μm, diameters of the opening portions 29A and 29B can be set to be 20 μm, for example. In this case, depths of the opening portions 29A and 29B can be set to be 50 μm, for example.

Figure 12:
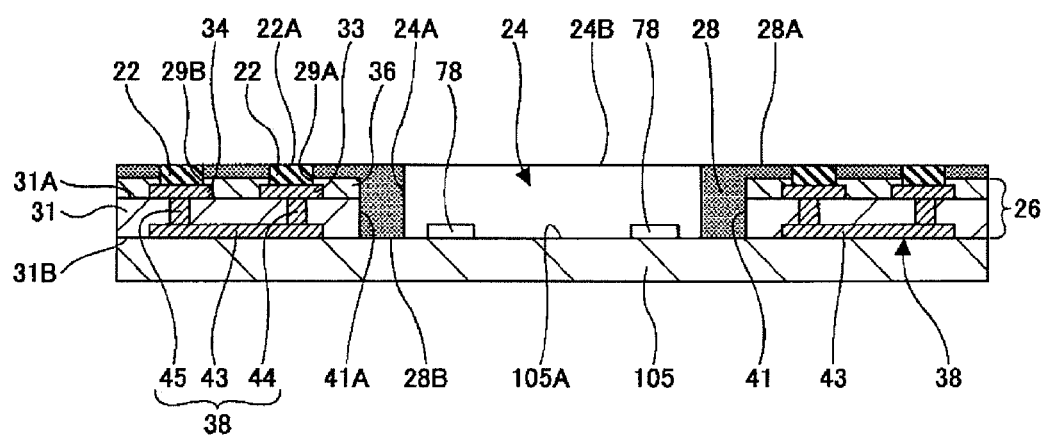
FIG. 12 is a view (No. 8) showing a step of manufacturing the semiconductor device according to the first embodiment of the invention.
Figure 13:
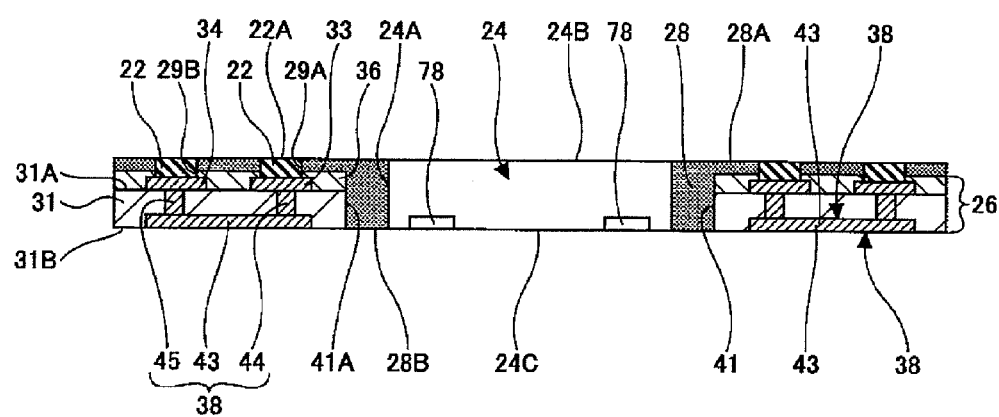
FIG. 13 is a view (No. 9) showing a step of manufacturing the semiconductor device according to the first embodiment of the invention.

At a step shown in FIG. 13, then, the support 105 illustrated in FIG. 12 is removed (a support removing step). In the case in which the support 105 is a Cu plate, it can be removed by wet etching, for example.

Figure 14:
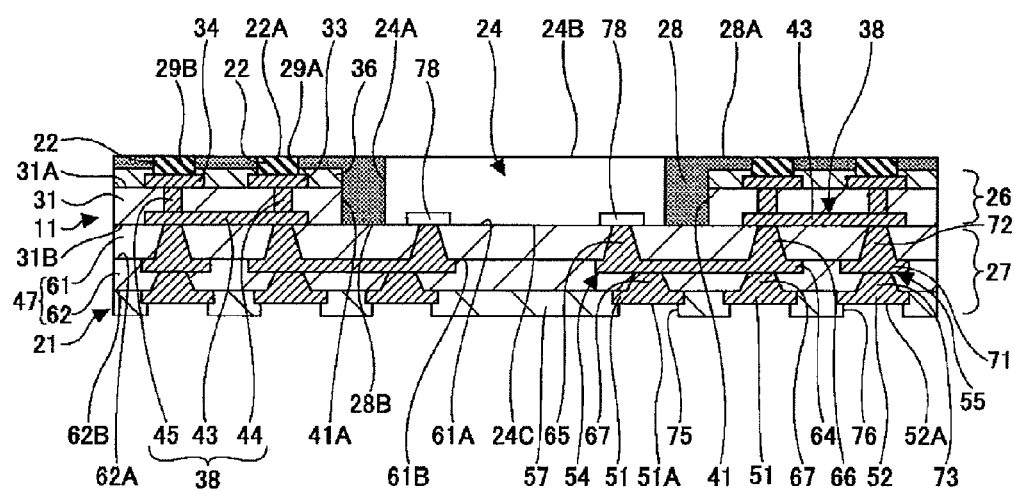
FIG. 14 is a view (No. 10) showing a step of manufacturing the semiconductor device according to the first embodiment of the invention.

At a step shown in FIG. 14, thereafter, the second multilayer wiring structure 27 is formed on a lower surface of the first multilayer wiring structure 26 (more specifically, the lower surface of the wiring 43 and the lower surface 31B of the first substrate body 31), the surface 24C of the electronic component 24 on a side where the electrode pad 78 is formed (which also includes the electrode pad 78) and a lower surface 28B of the sealing resin 28 in a part formed in the housing portion 41 by a buildup process (a second multilayer wiring structure forming step). The second multilayer wiring structure 27 has a second substrate body 47 constituted by a plurality of insulating layers 61 and 62 which is stacked, external connecting pads 51 and 52, a second wiring pattern 54 provided in the second substrate body 47 and connected to the wiring 43 (one of components of the first wiring pattern 38) and the electrode pad 78, a second wiring pattern 55 which is electrically connected to the wiring 43, and a solder resist layer 57.

Consequently, there is formed the wiring board 21 sealing the electronic component 24. As the insulating layers 61 and 62, for example, it is possible to use an insulating resin layer (such as a resin layer constituted by an epoxy resin). The external connecting pads 51 and 52 and the second wiring patterns 54 and 55 can be formed by a semiadditive method, for example. As materials of the external connecting pads 51 and 52 and the second wiring patterns 54 and 55, for example, it is possible to use Cu.

Figure 15:
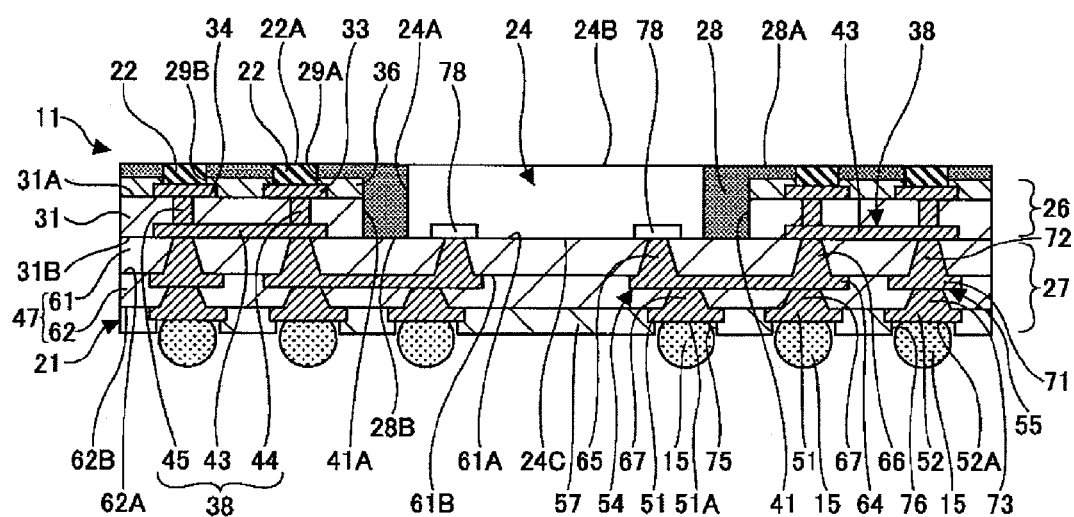
FIG. 15 is a view (No. 11) showing a step of manufacturing the semiconductor device according to the first embodiment of the invention.

At a step shown in FIG. 15, next, a single external connecting terminal 15 is formed on each of lower surfaces 51A and 52A of the external connecting pads 51 and 52. Consequently, the semiconductor device 11 according to the embodiment is manufactured. As the external connecting terminal 15, for example, it is possible to use a solder ball.

According to the method of manufacturing a semiconductor device in accordance with the embodiment, the first multilayer wiring structure 26 having the housing portion 41 is bonded to the upper surface of the support 105, the electronic component 24 having the greater thickness than the thickness of the first multilayer wiring structure 26 is then bonded to the upper surface 105A of the support 105 in the part exposed to the housing portion 41, the sealing resin 28 covering the upper surface of the first multilayer wiring structure 26 and the electronic component 24 is thereafter formed, the sealing resin 28 and the electronic component 24 are subsequently polished to reduce the thickness of the electronic component 24 (to change the electronic component 24 into a thin plate), and furthermore, to set the surface 24B of the electronic component 24 subjected to the polishing on almost the level with the upper surface 28A of the sealing resin 28. Consequently, the electronic component 24 changed into the thin plate is prevented from being protruded from the upper surface of the wiring board 21 (more specifically, the upper surface 28A of the sealing resin 28). Thus, it is possible to reduce the size in the thickness direction of the first semiconductor device 11.

After the removal of the support 105, moreover, the second multilayer wiring structure 27 including the second wiring pattern 54 having a via 65 to be directly connected to the electrode pad 78 and connected to the wiring 43 (one of the components of the first wiring pattern 38) is formed, by the buildup process, on the lower surface of the first multilayer wiring structure 26 (more specifically, the lower surface of the wiring 43 and the lower surface 31B of the first substrate body 31), the surface 24C of the electronic component 24 on the side where the electrode pad 78 is formed (including the electrode pad 78), and the lower surface 28B of the sealing resin 28 in the part formed in the housing portion 41. Consequently, it is possible to electrically connect the electrode pad 78 to the second wiring pattern 54 without using a bump (for example, a solder bump or an Au bump). Therefore, it is possible to further reduce the size in the thickness direction of the semiconductor device 11.

(Second Embodiment)

Figure 16:
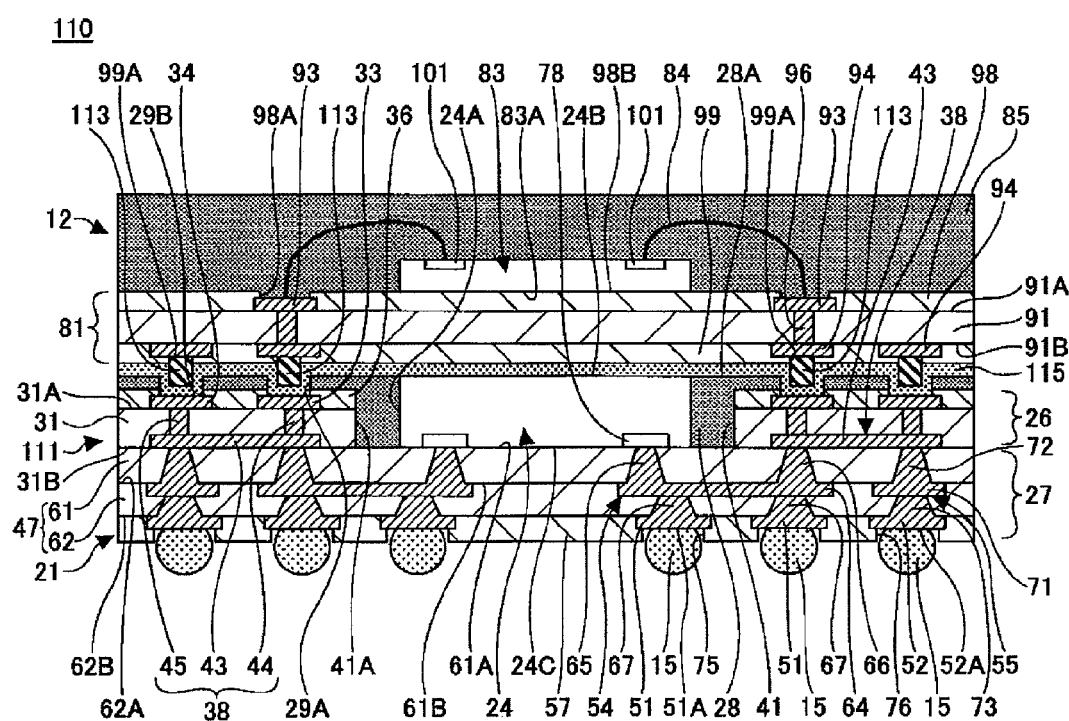
FIG. 16 is a sectional view showing an electronic apparatus according to a second embodiment of the invention.

FIG. 16 is a sectional view showing an electronic apparatus according to a second embodiment of the invention. In FIG. 16, the same components as those of the electronic apparatus 10 according to the first embodiment have the same designations.

With reference to FIG. 16, an electronic apparatus 110 according to the second embodiment has the same structure as that of the electronic apparatus 10 except that a semiconductor device 111 and an internal connecting terminal 113 are provided in place of the semiconductor device 11 and the internal connecting terminal 13 which are provided in the electronic apparatus 10 according to the first embodiment, and a resin member 115 is further provided.

The semiconductor device 111 has the same structure as that of the semiconductor device 10 except that the conductive member 22 provided in the semiconductor device 10 described in the first embodiment is excluded from the components.

The semiconductor device 111 according to the second embodiment which has the structure can obtain the same advantages as those of the semiconductor device 11 according to the first embodiment. Moreover, the semiconductor device 111 can be manufactured by carrying out the same processings as the steps shown in FIGS. 5 to 11 and FIGS. 13 to 15 described in the first embodiment.

The internal connecting terminal 113 is disposed on a pad 94 provided in a semiconductor device 12. An upper end of the internal connecting terminal 113 is connected to the pad 94. A lower part of the internal connecting terminal 113 is covered with the resin member 115 (for example, an anisotropic conductive resin film). The internal connecting terminal 113 is electrically connected to a pad 33 or a pad 34 through the resin member 115. Consequently, the internal connecting terminal 113 electrically connects the semiconductor device 111 to the semiconductor device 12.

The electrical connection of the semiconductor device 111 to the semiconductor device 12 is carried out by forming the internal connecting terminal 113 on the pad 94 of the semiconductor device 12, then forming the resin member 115 for covering the internal connecting terminal 113 on a lower surface of the semiconductor device 12, and thereafter pressing the semiconductor device 12 having the internal connecting terminal 113 and the resin member 115 formed therein against the semiconductor device 111. By the pressing, a thickness of the resin member 115 is smaller than a thickness before the pressing.

As the internal connecting terminal 113, for example, it is possible to use a metal post. As the metal post, for example, it is possible to use a Cu post formed by a plating method. In the case in which the Cu post is used as the internal connecting terminal 113, a height of the internal connecting terminal 113 can be set to be 50 μm, for example.

The resin member 115 is provided to cover an upper surface side of the semiconductor device 111. The resin member 115 is disposed to seal a clearance between the semiconductor device 111 and the semiconductor device 12. As the resin member 115, for example, it is possible to use an anisotropic conductive resin film. In the case in which the anisotropic conductive resin film is used as the resin member 115, a thickness of the resin member 115 before the pressing can be set to be 50 μm, for example. In this case, the thickness of the resin member 115 after the pressing can be set to be 30 μm, for example.

According to the electronic apparatus in accordance with the embodiment, the semiconductor device 111 and the semiconductor device 12 are electrically connected to each other by using the internal connecting terminal 113 formed by the metal post in place of the conductive member 22 and the internal connecting terminal 13 which have been described in the first embodiment. Consequently, it is possible to further reduce a size in a thickness direction of the electronic apparatus 110.

By providing the resin member 115 between the semiconductor device 111 and the semiconductor device 12, moreover, an adhesion between the semiconductor device 111 and the semiconductor device 12 is enhanced. Consequently, it is possible to enhance an electrical connecting reliability between the semiconductor device 111 and the semiconductor device 12.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A semiconductor device comprising:
a first multilayer wiring structure having a first surface and a second surface which is positioned on an opposite side to the first surface, the first multilayer wiring structure having a first wiring pattern formed on the second surface side and a housing portion penetrating through the first multilayer wiring structure from the first surface to the second surface;
an electronic component having an electrode pad, the electronic component being accommodated in the housing portion in a state that an electrode pad formation surface at the side where the electrode pad is formed is positioned on the second surface side of the first multilayer wiring structure; and
a second multilayer wiring structure having an insulating layer and a second wiring pattern which are stacked on the second surface of the first multilayer wiring structure and the electrode pad formation surface of the electronic component,
wherein the second wiring pattern is electrically connected to the first wiring pattern and the electrode pad,
wherein the second multilayer wiring structure has a plurality of external connecting pads formed on a surface which is positioned on an opposite side to a surface which is in contact with the first multilayer wiring structure, and
wherein the plurality of external connecting pads are electrically connected to the second wiring pattern.

2. The semiconductor device according to claim 1,
wherein the second wiring pattern has vias penetrating through the insulating layer, and
wherein the vias are directly connected to the first wiring pattern and the electrode pad.

3. The semiconductor device according to claim 1,
wherein the first multilayer wiring structure has a plurality of pads on the first surface side, and
wherein the plurality of pads are electrically connected to the first wiring pattern.

4. The semiconductor device according to claim 1, further comprising:
a sealing resin which fills a clearance between a side surface of the housing portion and a side surface of the electronic component.

5. The semiconductor device according to claim 4, wherein a surface of the electronic component which is positioned on an opposite side to the electrode pad formation surface is exposed from the sealing resin and is on almost the level with an upper surface of the sealing resin.

6. A method of manufacturing a semiconductor device comprising:
a first step of forming a first multilayer wiring structure having a first surface and a second surface positioned on an opposite side to the first surface, a first wiring pattern formed on the second surface side, and a housing portion penetrating through the first multilayer wiring structure from the first surface to the second surface;
a second step of bonding the first multilayer wiring structure to a support in a state that the second surface of the first multilayer wiring structure is in contact with the support;
a third step of bonding an electronic component on the support in a state that an electrode pad formation surface at the side where an electrode pad is formed of the electronic component is bonded to a portion exposed from the housing portion of the support;
a fourth step of filing a clearance between a side surface of the housing portion and a side surface of the electronic component with a sealing resin;
a fifth step of removing the support; and
a sixth step of forming a second multilayer wiring structure by stacking an insulating layer and a second wiring pattern on the second surface of the first multilayer wiring structure and the electrode pad formation surface of the electronic component and the sealing resin which are exposed by removing the support in the fifth step.

7. The method of manufacturing a semiconductor device according to claim 6,
wherein the second wiring pattern has vias penetrating through the insulating layer, and
wherein the vias are directly connected to the first wiring pattern and the electrode pad at the sixth step.

8. The method of manufacturing a semiconductor device according to claim 6, wherein the fourth step includes forming the sealing resin by filling the clearance between the side surface of the housing portion and the side surface of the electronic component and also covering a surface of the electronic component which is positioned on an opposite side to the electrode pad formation surface and the first surface of the first multilayer wiring structure, and then reducing a thickness of the electronic component by polishing the sealing resin and the electronic component in a part positioned on an opposite side to the electrode pad formation surface.

9. The method of manufacturing a semiconductor device according to claim 6, wherein the sixth step includes forming an external connecting pad which is electrically connected to the second wiring pattern on a surface of the second multilayer wiring structure which is positioned on an opposite side to a surface which is in contact with the first multilayer wiring structure.

10. The method of manufacturing a semiconductor device according to claim 6, wherein the first multilayer wiring structure includes a pad on the first surface of the first multilayer wiring structure, the pad being electrically connected to the first wiring pattern.

11. An electronic apparatus comprising:
a semiconductor device including:
a first multilayer wiring structure having a first surface and a second surface which is positioned on an opposite side to the first surface, the first multilayer wiring structure having a first wiring pattern formed on the second surface side and a housing portion penetrating through the first multilayer wiring structure from the first surface to the second surface;
an electronic component having an electrode pad, the electronic component being accommodated in the housing portion in a state that an electrode pad formation surface at the side where the electrode pad is formed is positioned on the second surface side of the first multilayer wiring structure; and
a second multilayer wiring structure having an insulating layer and a second wiring pattern which are stacked on the second surface of the first multilayer wiring structure and the electrode pad formation surface of the electronic component,
wherein the second wiring pattern is electrically connected to the first wiring pattern and the electrode pad,
wherein the first multilayer wiring structure has a plurality of pads on the first surface side, and
wherein the plurality of pads are electrically connected to the first wiring pattern;
another semiconductor device including a wiring board having a plurality of semiconductor device connecting pads which are opposed to the pads of the first multilayer wiring structure of the semiconductor device; and
an internal connecting terminal provided between the semiconductor device and the another semiconductor device and serving to electrically connect the pads of the first multilayer wiring structure of the semiconductor device to the semiconductor device connecting pads of the another semiconductor device.

* * * * *